US009619416B2

(12) United States Patent
Hunsaker et al.

(10) Patent No.: US 9,619,416 B2
(45) Date of Patent: *Apr. 11, 2017

(54) INTER-COMPONENT COMMUNICATION INCLUDING POSTED AND NON-POSTED TRANSACTIONS

(71) Applicant: Intel Corporation, Santa Clara, CA (US)

(72) Inventors: Mikal C. Hunsaker, El Dorado Hills, CA (US); Su Wei Lim, Klang (MY); Ricardo E. James, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 14/667,997

(22) Filed: Mar. 25, 2015

(65) Prior Publication Data

US 2015/0199296 A1 Jul. 16, 2015

Related U.S. Application Data

(63) Continuation of application No. 14/537,859, filed on Nov. 10, 2014, now Pat. No. 9,176,918, which is a (Continued)

(51) Int. Cl.
*G06F 13/00* (2006.01)
*G06F 13/364* (2006.01)
(Continued)

(52) U.S. Cl.
CPC .............. *G06F 13/364* (2013.01); *G06F 1/06* (2013.01); *G06F 1/24* (2013.01); *G06F 11/0727* (2013.01);
(Continued)

(58) Field of Classification Search
USPC .......................... 710/104–110, 305–311, 3–7
See application file for complete search history.

(56) References Cited

U.S. PATENT DOCUMENTS 6,026,461 A 2/2000 Baxter
6,055,598 A 4/2000 Lange
(Continued)

OTHER PUBLICATIONS

Office Action Received for U.S. Appl. No. 13/436,697, mailed on Apr. 8, 2014, 8 pages.
(Continued)

*Primary Examiner* — Raymond Phan
(74) *Attorney, Agent, or Firm* — Compass IP Law

(57) ABSTRACT

Component apparatuses with inter-component communication capabilities, and system having such component apparatuses are disclosed herein. In embodiments, such a component may include a number of control pins including a clock pin, a number of data pins, and a logic unit. The logic unit may be configured to receive a clock signal from another component through the clock pin, to provide an alert signal to the other component through a selected one of the control and data pins to initiate a transaction with the other component, to receive in response to the alert signal from the other component through the data pins a status request to determine nature of the transaction, and to provide in response to the status request to the other component through the data pins a status to indicate the nature of the transaction. The provision of the alert signal, the receipt of the status request and the provision of the status may be in reference to the clock signal. Other embodiments may be disclosed or claimed.

28 Claims, 12 Drawing Sheets

Related U.S. Application Data continuation of application No. 13/436,697, filed on Mar. 30, 2012, now Pat. No. 8,892,800.

(60) Provisional application No. 61/596,958, filed on Feb. 9, 2012.

(51) Int. Cl.

| | | |
|---|---|---|
| *G06F 1/06* | (2006.01) | |
| *G06F 1/24* | (2006.01) | |
| *G06F 13/42* | (2006.01) | |
| *G06F 11/07* | (2006.01) | |
| *G06F 11/10* | (2006.01) | |
| *G06F 11/22* | (2006.01) | |
| *G06F 13/12* | (2006.01) | |
| *G06F 13/40* | (2006.01) | |
| *G06F 11/30* | (2006.01) | |
| *G06F 13/16* | (2006.01) | |

(52) U.S. Cl.
CPC ........ *G06F 11/1004* (2013.01); *G06F 11/221* (2013.01); *G06F 11/2289* (2013.01); *G06F 11/3027* (2013.01); *G06F 13/00* (2013.01); *G06F 13/122* (2013.01); *G06F 13/1668* (2013.01); *G06F 13/4068* (2013.01); *G06F 13/423* (2013.01); *G06F 13/4221* (2013.01); *G06F 13/4234* (2013.01); *G06F 13/4291* (2013.01)

(56) References Cited

U.S. PATENT DOCUMENTS

| | | | |
|---|---|---|---|
| 6,519,650 | B1 | 2/2003 | Kawasaki |
| 6,687,766 | B1 | 2/2004 | Casper |
| 7,376,810 | B2 | 5/2008 | Polizzi et al. |
| 7,493,433 | B2 | 2/2009 | Behrendt et al. |
| 7,698,493 | B2 | 4/2010 | Asaro |
| 8,135,881 | B1 | 3/2012 | Obkircher |
| 8,205,017 | B2 | 6/2012 | Parr et al. |
| 8,495,255 | B2 | 7/2013 | Butler |
| 8,645,585 | B2 | 2/2014 | Wyatt |
| 8,892,800 | B2 | 11/2014 | Hunsaker et al. |
| 8,990,464 | B2 | 3/2015 | Kessler |
| 9,418,030 | B2 * | 8/2016 | Hunsaker .............. G06F 13/364 |
| 2005/0289269 | A1 | 12/2005 | Nakayama et al. |
| 2006/0253614 | A1 | 11/2006 | Melton |
| 2007/0250648 | A1 | 10/2007 | Picard et al. |
| 2008/0155366 | A1 | 6/2008 | Hou |
| 2008/0235428 | A1 | 9/2008 | Yu |
| 2009/0125659 | A1 | 5/2009 | Behrendt et al. |
| 2012/0005385 | A1 | 1/2012 | Hsu |
| 2012/0137031 | A1 | 5/2012 | Evoy et al. |
| 2013/0132626 | A1 | 5/2013 | Furlan |
| 2013/0198427 | A1 | 8/2013 | Leitner et al. |

OTHER PUBLICATIONS

Motorola Inc., M68HC11 Reference Manual, "M68HC11 Microcontrollers", Rev. 6.1, 2002, 650 Pages.

"SPI—Serial Peripheral Interface", retrieved from www.mct.net on Apr. 6, 2015, 20 Pages.

Open NAND Flash Interface Specification, Revision 2.0, Feb. 27, 2008, 174 Pages.

PCI Express Base Specification, Revision 1.0a, Apr. 15, 2003, 428 Pages.

Motorola Inc,"Queued Serial Module", Reference Manual, 1996, 112 Pages.

Motorola, Inc., SPI Block Guide, V03.06, Feb. 4, 2003, 38 Pages.

Ramesh Sivakolundu et al., "AN-579 Microwire/Plus Serial Interface for COP800 Family", Literature No. SNOA093, Texas Instruments, May 1989, 14 Pages.

Abdul Aleaf, "AN-452 Microwire Serial Interface", Literature No. SNOA743, Texas Instruments, Jan. 1992, 14 Pages.

Spansion Backgrounder, "Serial Peripheral Interface (SPI) Flash Memory: Multiple I/Os Bring High Performance to Low-Cost Memory Subsystems", 2009, 3 Pages.

Office Action Received for U.S. Appl. No. 14/537,859, mailed on Mar. 13, 2015, 7 pages.

Notice of Allowance mailed Jul. 16, 2014, issued in U.S. Appl. No. 13/436,697, filed Mar. 30, 2012, 5 pages.

Motorola Inc., M68HC11 Reference Manual, "M68HC11 Microcontrollers", Rev. 3, 1991, 498 Pages.

Office Action Received for U.S. Appl. No. 14/668,114, mailed on Sep. 11, 2015, 6 pages.

Office Action received for U.S. Appl. No. 14/668,013 mailed on Sep. 23, 2016, 13 pages.

* cited by examiner

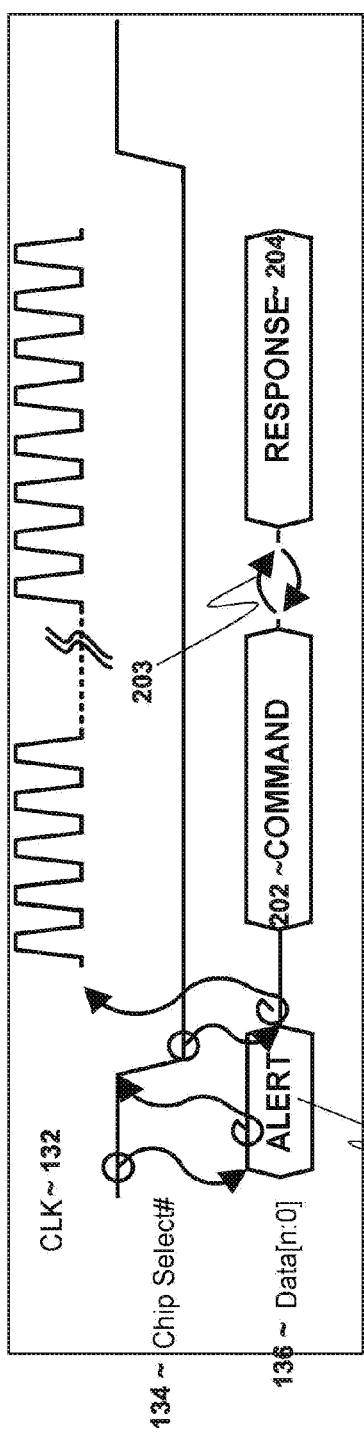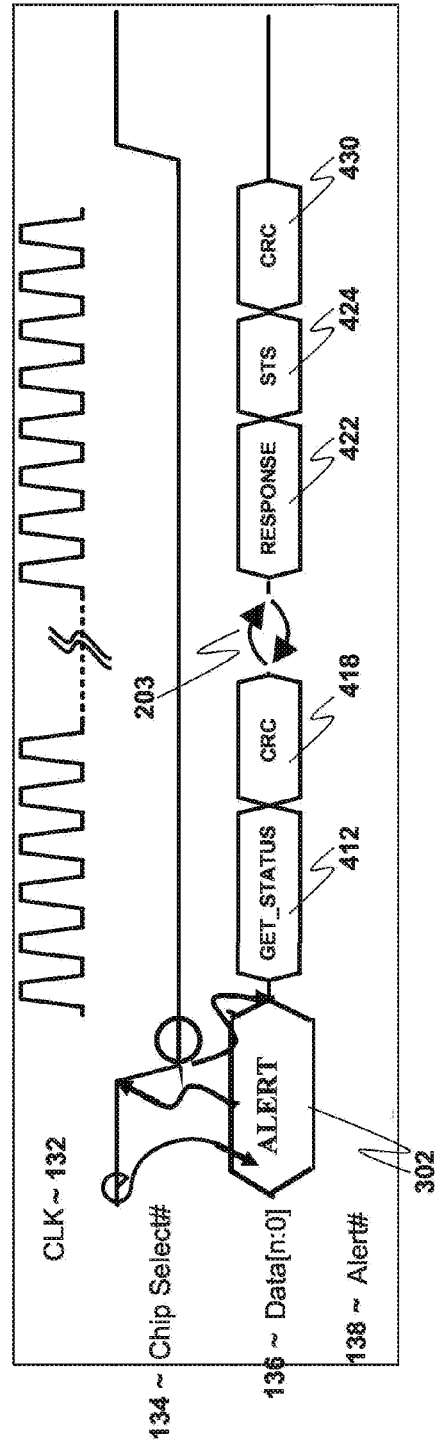

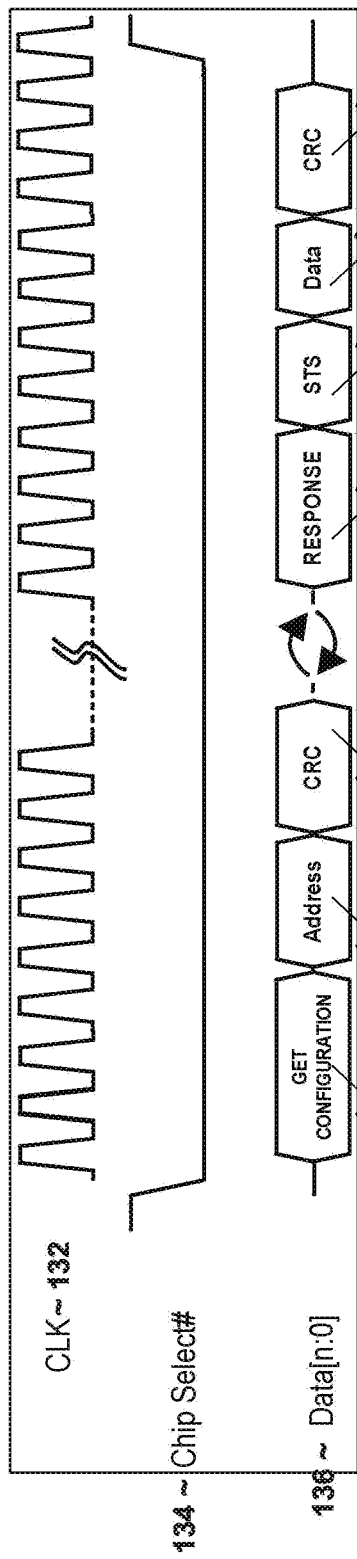
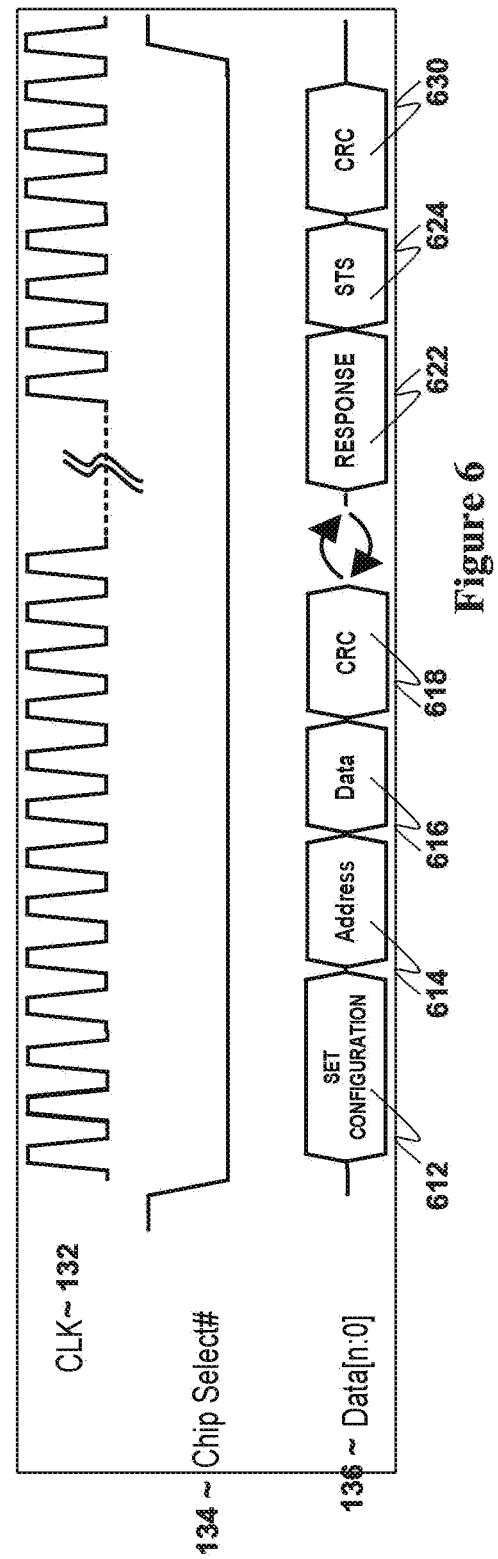

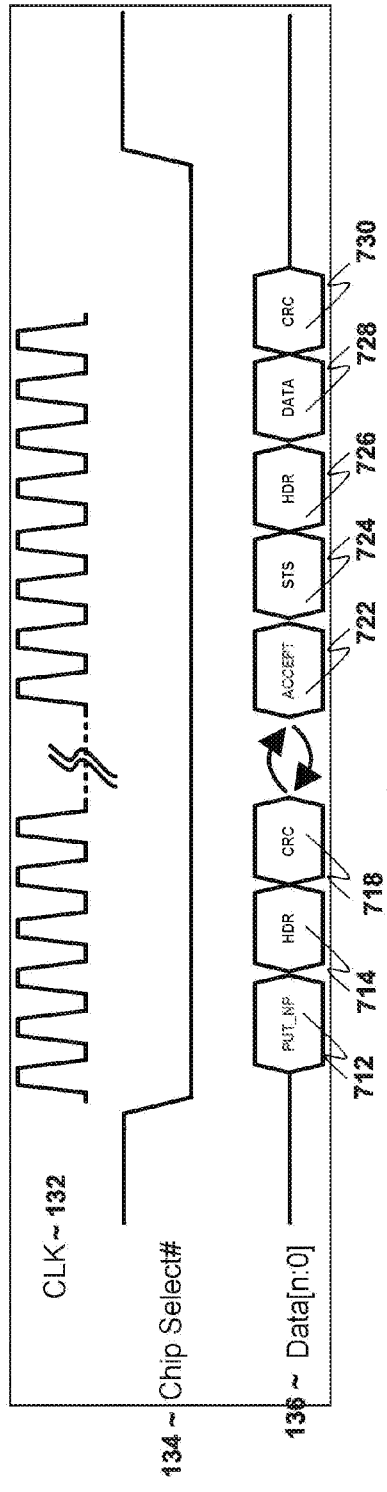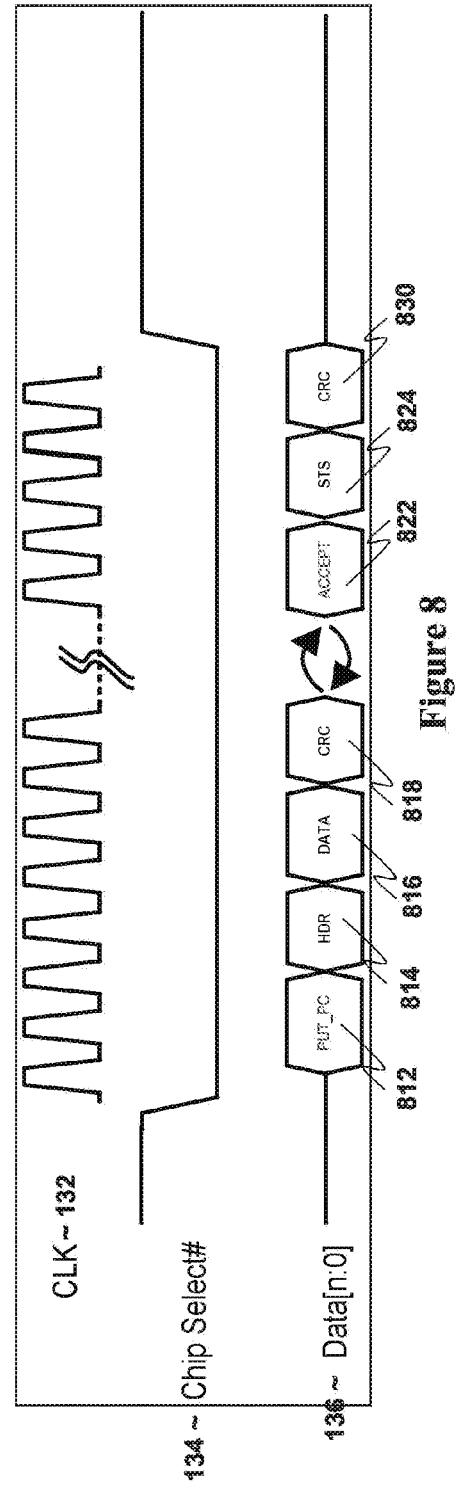

INTER-COMPONENT COMMUNICATION INCLUDING POSTED AND NON-POSTED TRANSACTIONS

RELATED APPLICATIONS

This application is a continuation of U.S. patent application Ser. No. 14/537,859, entitled "Inter-Component Communication Including Slave Component Initiated Transaction," filed on Nov. 10, 2014, which is a Continuation of U.S. patent application Ser. No. 13/436,697, entitled "Inter-Component Communication Including Slave Component Initiated Transaction," filed on Mar. 30, 2012, now patented as U.S. Pat. No. 8,892,800, issued on Nov. 18, 2014, and claims priority to provisional application No. 61/596,958, filed on Feb. 9, 2012.

TECHNICAL FIELD

This application relates to the technical field of data processing, more specifically to methods and apparatuses associated with inter-component communication, including slave component initiated transaction.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In the early days of personal computing systems, peripherals were relatively simple in their functionalities. Peripherals were often coupled to the host central processing unit (CPU) via simple 2-wire serial buses, such as the Inter-Integrated Circuit ($I^2C$) bus, or its later variant, the System Management bus (SMBUS). As peripheral functionalities increase, many peripherals began to be coupled to the host CPU using the Industry Standard Architecture (ISA) bus. Depending on the version, an ISA bus could include 62 or more pins.

In today's computing systems, notwithstanding the continuing increase in functionalities, embedded controller (EC), baseboard management controller (BMC) and super input/output (SIO) are often coupled to the host CPU through a more pin efficient Low Pin Count (LPC) bus. However, the LPC bus still requires at least 7 pins, and often, another 6 "optional" pins, a total of 13 pins. Further, on top of the still relatively high pin count, the LPC bus is still based on the old 3.3v I/O signaling technology, with the frequency of the bus clock fixed at 33 MHz. Accordingly, the LPC bus has a relatively low bandwidth of 133 Mbps. With recent advances, the LPC bus has been deemed insufficient to handle the demand of a new generation of peripheral devices, which require low cost and medium bandwidth connection.

On some platforms, peripherals may be coupled to the host CPU using the Serial Peripheral Interface (SPI) bus. The SPI bus is a 4-wire serial bus, 5-wires in some embodiments. However, the SPI bus lacks a defined protocol. At the other end, peripherals may be coupled to the host CPU through a high speed bus, such as PCI Express [PCI=Peripheral Component Interconnect]. Such solution is often considered to be too costly. Further, there exist a significant number of sideband signals used for communication between the bridging chipset and peripheral controllers, such as an EC, a BMC or a SIO, that consume significant pin cost.

BRIEF DESCRIPTION OF THE DRAWINGS

Embodiments of the present invention will be described by way of exemplary embodiments, but not limitations, illustrated in the accompanying drawings in which like references denote similar elements, and in which:

FIG. 3 illustrates a slave component initiated transaction;

FIG. 4 illustrates the master and slave components conducting the slave component initiated transaction;

FIG. 5 illustrates a get configuration command;

FIG. 6 illustrates a set configuration command;

FIG. 7 illustrates a master component initiated non-posted transaction;

FIG. 8 illustrates a master component initiated posted transaction;

DETAILED DESCRIPTION

Methods and apparatuses associated with inter-component communication, including slave component initiated transactions are disclosed herein.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, descriptions of operations as separate operations should not be construed as requiring that the operations be necessarily performed independently and/or by separate entities. Descriptions of entities and/or modules as separate modules should likewise not be construed as requiring that the modules be separate and/or perform separate operations. In various embodiments, illustrated and/or described operations, entities, data, and/or modules may be merged, broken into further sub-parts, and/or omitted.

The phrase "in one embodiment" or "in an embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)".

Figure 1:
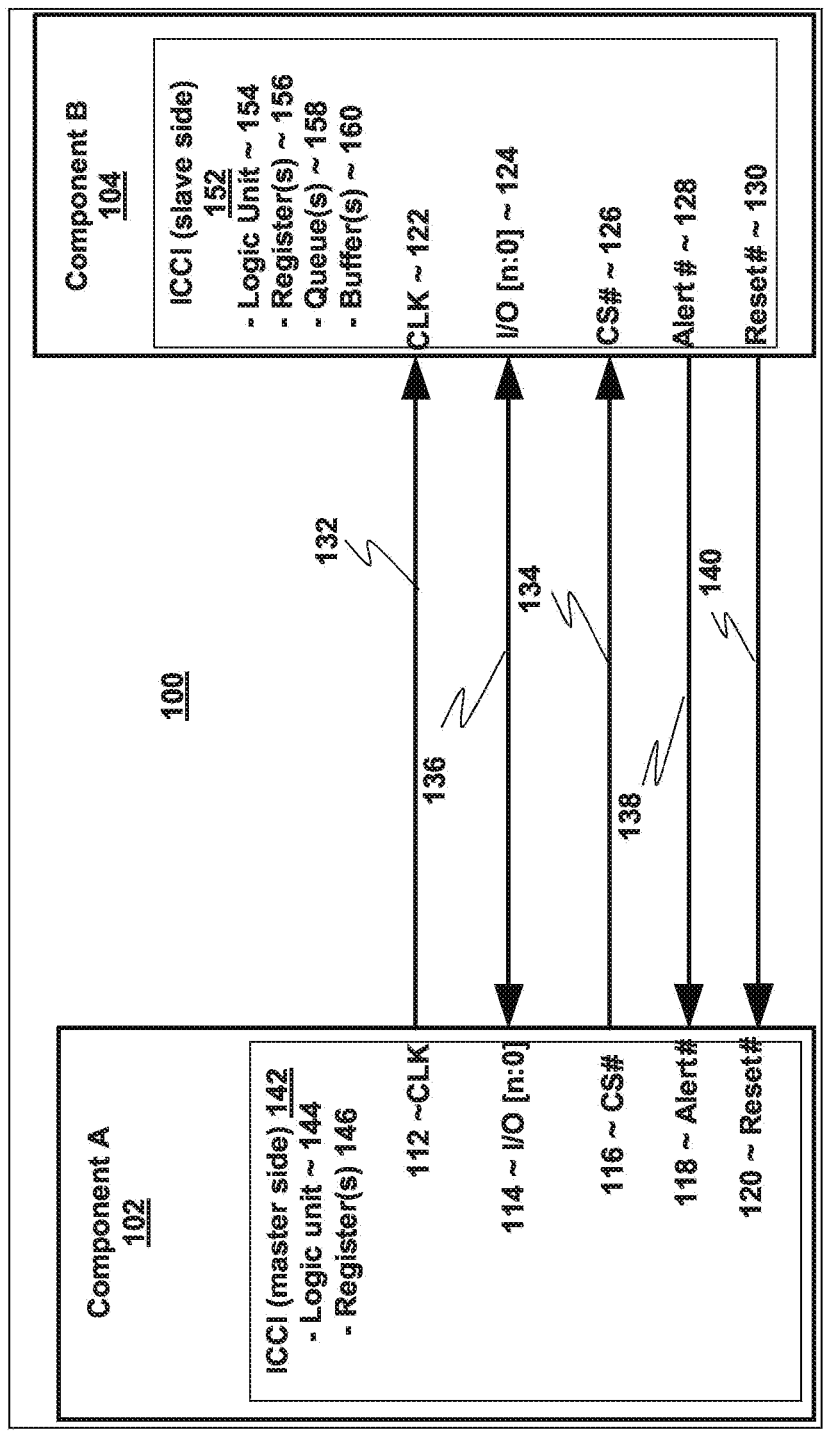
FIG. 1 illustrates a single master component and a single slave component inter-component communication arrangement.

FIG. 1 illustrates an inter-component communication arrangement, in accordance with embodiments of the present disclosure. As shown, arrangement 100 couples components A and B, 102 and 104, using an inter-component communication interface (ICCI). Component A 102 may be configured with master side 142 of ICCI, while component B 104 may be configured with slave side 152 of ICCI. ICCI master and slave sides 142 and 152 may be configured with logic units 144 and 154, one or more registers 146 and 156, clock (CLK) pins 112 and 122, data (I/O [0:n]) pins 114 and 124 and chip select (CS#) pins 116 and 126, respectively. Further, ICCI slave side 152 may be configured with one or more queues 158 and one or more buffers 160.

In various embodiments, the signal path coupling clock pins 112 and 122 may be unidirectional, configured to enable component A 102 to provide clock signal 132 to component B 104. The signal paths coupling data (I/O [0:n]) pins 114 and 124 may be bidirectional to enable either component 102 or 104 to provide data signals 136 to the other component. The signal path coupling chip select (CS#) pins 116 and 126 may be unidirectional to enable component A 102 to provide chip select signal 134 to component B 104.

In various embodiments, data signals 136, in particular, one of data signals 136, e.g. I/O[1], may also enable component B 104 to provide an alert event to component A 102, indicating component B 104 is in need of service by component A 102.

In alternate embodiments, the ICCI may further include alert pins, 118 and 128, respectively disposed on the components. For these embodiments, the signal path coupling alert pins 118 and 128 may be employed by component B 104 to provide alert signal 138 to component A 102, indicating component B 104 in need of service by component A 102 instead (in lieu of using data signal 136).

In various embodiments, the ICCI may further include reset pins 120 and 130, respectively disposed on the components. The signal path coupling reset pins 120 and 130 may be unidirectional, enabling component B 104 to provide reset signal 140 to component A 102 to trigger a reset of the ICCI. In other embodiments (not shown), the signal path coupling reset pins 120 and 130 may be unidirectional, enabling component A 102 to provide reset signal 140 to component B 104 to trigger a reset of the ICCI instead.

In various embodiments, registers 156 may be addressable, and include one or more status registers to store one or more corresponding service requests. In embodiments, registers 156 may contain addressable register space up to 4 KB. In embodiments, access of the register space may be addressed at double word (DWord) boundary. In embodiments, the addresses may be 16-bit addresses, with only the lower 12-bits of the 16-bit address used. The 4 most significant bits (MSB) of the access addresses may be driven to zeros by logic unit 144 of ICCI master side 142 or ignored by ICCI slave side 152.

In various embodiments, the service requests may be posted or non-posted transactions. Non-posted transactions may have their completions terminated as connected or deferred.

In embodiments, component A 102 may e.g., be a Platform Controller Hub (PCH) incorporated with various teachings of the present disclosure. Component B 104 may e.g., be an EC or a BMC, incorporated with various teachings of the present disclosure. In embodiments, the various incorporated teachings may include reset pin 130 and provision of reset signal 140 to component A 102. In other embodiments, component B 104 may be non-EC/BMC peripherals, incorporated with various teachings of the present disclosure. For these other embodiments, the various incorporated teachings may include reset pin 130 and receiving reset signal 140 from component A 102. Further, in various embodiments, the services request may include peripheral access requests, virtual wire messages, out-of-band (OOO) messages and/or Flash access requests. In embodiments, the different types of requests may be made and serviced through respective channels, e.g., a channel for peripheral access requests, a channel for virtual wire messages, a channel for out-of-band (OOO) messages and/or a channel for Flash access requests.

Before further describing arrangement 100, it is noted that while for ease of understanding, only one component A 102 and one component B 104 are shown in FIG. 1, the present disclosure is not so limited. In various embodiments, arrangement 100 may e.g., include one component A 102, one component B 104 asserting reset as shown, and one or more component B 104 receiving reset from component A 102 (not shown), to be described more fully below, after further description of the one master-one slave embodiment.

Figure 2:
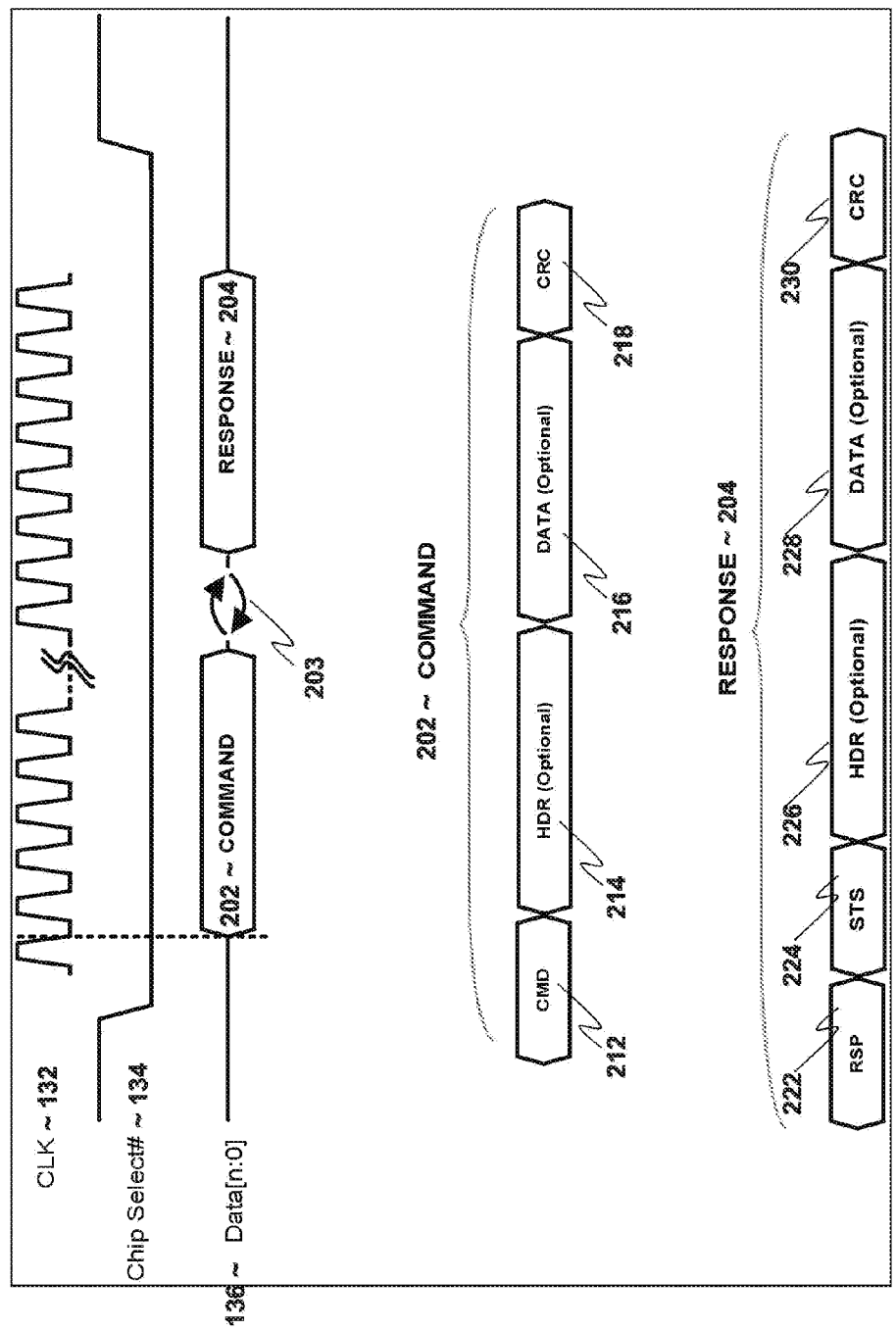
FIG. 2 illustrates a command and response communication protocol of the arrangement of FIG. 1.

Referring now to FIG. 2, wherein an overview of the communication protocol of arrangement 100 in accordance with various embodiments, is illustrated. As shown, in various embodiments, logic unit 144 of ICCI master side 142 may be configured to assert chip select signal 134, if provided, to select the slave component, when clock signal 132 is low. Further, logic unit 144 of ICCI master side 142 may be configured to launch data signals 136 on the falling edge of clock signal 132, and logic unit 154 of ICCI slave side 152 may be configured to sample data signals 136 on the rising edge of clock signal 132. Logic unit 154 of ICCI slave side 152 may be configured to launch data signals 136 on the falling edge of clock signal 132. Logic unit 144 of ICCI master side 142 may be configured to implement anyone of a number of more flexible sampling schemes, when ICCI master side 142 is configured to provide clock signal 132.

In various embodiments, ICCI master side 142 and ICCI slave side 152 may be configured to provide data signals 136, to conduct transactions, in multiple of 8-bits (one Byte). In various embodiments, ICCI master and slave sides 142 and 152 may be configured to conduct transactions having three phases, command phase 202, turn-around (TAR) phase 203, and response phase 204. Logic unit 144 of ICCI master side 142 may be configured to drive command phase 202. Logic unit 154 of ICCI slave side 152 may be configured to drive response phase 204.

Command phase 202 may include a command (CMD) 212, an optional header (HDR) 214, optional DATA 216, and optional cyclic redundancy check (CRC) value 218. CMD 212 may include a command opcode. In various embodiments, a command opcode may be 8-bits wide. Response phase 204 may include a response (RSP) 222, Status (STS) 224, an optional header (HDR) 226, optional data 228 and CRC 230. RSP 222 may include a response opcode. In various embodiments, a response opcode may be 8-bits wide.

In various embodiments, after the last bit of command phase 202 has been sent out, ICCI master side 142 may be configured to enter TAR phase 203 for a time period. The length of TAR phase 203 may be configured to be long enough to provide sufficient time for ICCI slave side 152 to sample the command and prepare the response. ICCI master side 142 may be configured to tri-state the signal paths for data signals 136 during TAR phase 203.

In various embodiments, logic unit 144 of ICCI master side 142 may be configured to initiate a transaction through the assertion of chip select# signal 134, start clock signal 132, and drive a command 212 as data signals 136. In various embodiments, logic unit 144 of ICCI master side 142 may be configured to continue to toggle clock signal 132 until the complete response phase 204 has been received.

Referring now to FIGS. 3 and 4, wherein a slave component initiated transaction, in accordance with various embodiments, is shown. As illustrated in FIG. 3, logic unit 154 of ICCI slave side 152 may be configured to initiate a transaction by providing an alert event to ICCI master side 142. In various ones of the single master-single slave embodiments, logic unit 154 of ICCI slave side 152 may be configured to toggle the I/O[1] pin to low, to provide alert event 302. Logic unit 154 of ICCI slave side 152 may be configured to provide alert event 302 when chip select# signal 134 is high. Logic unit 154 of ICCI slave side 152 may be configured to hold the state of the I/O[1] pin until the chip select# signal 134 is asserted by the ICCI master side 142.

As shown in FIG. 4, once I/O[1] is released by ICCI slave side 152, logic unit 144 of ICCI master side 142 may proceed to enter command phase 202 and issue a GET_STATUS command 412 (along with CRC 418) to figure out the cause of alert signal 302. In response, after TAR phase 203, logic unit 154 of ICCI slave side 152 may proceed to response phase 204, and provide response 422 and status 424 (along with CRC 430) to enable ICCI master side 142 to determine the service requested (nature of the transaction desired).

In various embodiments, where multiple channels may be supported the GET_STATUS command may be a channel independent command, and may be used during command phase 202 to query the content of the status register. In response, the state of the status register may be returned in the subsequent following response phase 204.

In various embodiments, ICCI may support the following statuses:

TABLE I

Basic Statuses

| Status | Bit Position in Status Register | Description |
| --- | --- | --- |
| PC_FREE | 0 | When '1', indicates the target is free to accept at least one posted or completion header and data up to a maximum payload size. |

TABLE I-continued

Basic Statuses

| Status | Bit Position in Status Register | Description |
| --- | --- | --- |
| NP_FREE | 1 | When '1', indicates the target is free to accept at least one non-posted header and 1 DW of Data (if applicable). |
| PC_AVAIL | 2 | When '1', indicates the master has a posted or completion header and optional data up to a maximum payload size available to send. |
| NP_AVAIL | 3 | When '1', indicates the master has a non-posted header and optional DW of data available to send. |

In various embodiments, ICCI master and slave sides 142 and 152, through logic units 144 and 154, and queues 158, may be configured to support multiple independent channels of communication over ICCI. Examples of channels, as alluded to earlier, may include a channel for peripheral, a channel for virtual wire messaging, a channel for out-of-bound messaging (e.g., for a tunneled SMBUS), a channel for storage device access (e.g., for a Flash device), and so forth. In these embodiments, a command opcode may indicate channel specific commands, and/or link management commands. Channels specific commands may include a Put and a Get command to write and read data for a specific channel. Link management commands may include a GET_CONFIGURATION command and a SET_CONFIGURATION command to retrieve and set configuration information. In particular, the GET_CONFIGURATION command and SET_CONFIGURATION commands may be used to access or set the Channel Capability and Configuration registers on ICCI slave side 152. In various embodiments, ICCI slave side 152 may be configured to support DWord accesses. In various embodiments, the support may be provided without byte enables, using Read-Modify-Write accesses.

In various embodiments, ICCI may be configured such that completion of the SET_CONFIGURATION and GET_CONFIGURATION commands may not be deferred. That is, these commands are to be completed within the same cycle. In various embodiments, completion of non-posted commands may be deferred, that is, completed over multiple cycles, to be described in more detail below.

In various embodiments, ICCI may further support the following statuses:

TABLE II

Channel Specific Statuses

| Status | Bit Position in Status Register | Description |
| --- | --- | --- |
| Out-of-Bound Messaging Channel | | |
| OOB_FREE | 4 | When '1', indicates the target is free to accept at least one OOB (tunneled SMBus) message with data up to maximum payload size. |
| OOB_AVAIL | 5 | When '1', indicates the master has an OOB (tunneled SMbus) message with data up to maximum payload size available to send. |

TABLE II-continued

Channel Specific Statuses

| Status | Bit Position in Status Register | Description |
|---|---|---|
| Flash Access Channel | | |
| FLASH_ACC_FREE | 6 | When '1', indicates the target is free to accept at least one Flash Access message and data up to max_payload_size.. |
| FLASH_ACC_AVAIL | 7 | When '1', indicates the master has a Flash Access message and data up to max_payload_size available to send. |
| Virtual Wire Channel | | |
| VWIRE_AVAIL | 8 | When '1', indicates the master has a tunneled wire/pin available to send. |

In alternate embodiments, more or less statuses may be supported.

In various embodiments, ICCI may support the follow general and channel specific commands:

TABLE III

General and Channel Specific Commands

| CMD Opcode | Encoding [7:0] | Description |
|---|---|---|
| Peripheral Channel Commands | | |
| PUT_PC | 00000000 | Put a posted or completion header and optional data. |
| PUT_NP | 00000010 | Put a non-posted header and optional data. |
| GET_PC | 00000001 | Get a posted or completion header and optional data |
| GET_NP | 00000011 | Get a non-posted header and optional data. |
| Virtual Wire Channel Commands | | |
| PUT_VWIRE | 00000100 | Put a Tunneled (virtual) wire/pin. |
| GET_VWIRE | 00000101 | Get a Tunneled (virtual) wire/pin. |
| OOB Message Channel | | |
| PUT_OOB | 00000110 | Put an OOB (Tunneled SMBus) message. |
| GET_OOB | 00000111 | Get an OOB (Tunneled SMBus) message. |
| Flash Access Channel Commands | | |
| PUT_FLASH_ACC | 00001000 | Put a Flash Access transaction. |
| GET_FLASH_ACC | 00001001 | Get a Flash Access transaction. |
| Non-Channel Specific | | |
| GET_STATUS | 00100101 | Command initiated by the master to read the status register of the slave. |
| SET_CONFIGURATION | 00100010 | Command to set the capabilities of the slave as part of the initialization. This is typically done after the master discovers the capabilities of the slave. |
| GET_CONFIGURATION | 00100001 | Command to discover the capabilities of the slave as part of the initialization. |

In alternate embodiments, more or less commands may be supported.

In various embodiments, registers 146 and 156 of ICCI master and slave sides 142 and 152 may include General Capabilities and Configurations registers, respectively disposed, to store a Minimum Turn-Around Time value that specifies the duration of TAR phase 203. In various embodiments, logic unit 144 of ICCI master side 142 may be configured to set the Minimum Turn-Around Time value through the SET_CONFIGURATION command. Logic unit 144 of ICCI master side 142 may also be configured query and determine the Minimum Turn-Around Time value through the GET_CONFIGURATION command.

In various embodiments, logic unit 154 of ICCI slave side 152 may be configured to enter response phase 204, and drive a response at the end of TAR phase 203. In various embodiments, RSP 222 may include a response code.

In various embodiments, logic unit 154 of ICCI slave side 152 may generate an alert event due to e.g., any of the following reasons:
  There is a pending request.
  A target buffer has become free since the last status update was returned as not free.

In various embodiments, logic unit 154 of ICCI slave side 152 may be configured to generate another alert event to indicate that there are still pending requests waiting to be serviced, if there are multiple requests pending and the master component has not completed servicing all the requests.

In various embodiments, logic unit 154 of ICCI slave side 152 may be configured to clear the status register corresponding to the request that is just serviced by the ICCI master side 142. Further, logic unit 154 of ICCI slave side 152 may be configured to set the status field in the response phase to reflect the bit has been cleared, if there is no new request pending.

In various embodiments, logic unit 154 of ICCI slave side 152 may be configured to respond with a FATAL_ERROR response to indicate an error condition, when a command opcode is not supported on a packet with good CRC.

FIGS. 5 and 6 illustrate usage of the GET_CONFIGURATION and SET_CONFIGURATION commands. As shown in FIG. 5, GET_CONFIGURATION command 512 may be represent by an 8-bit command opcode, followed by a 16-bit address 514 and an 8-bit CRC 518. Response phase 204 may include an 8-bit response code 522, a 16-bit status 524, 1 DW of Data 526, and CRC 530. Similarly, as shown in FIG. 6, SET_CONFIGURATION command 612 may be represented by an 8-bit command opcode, followed by a 16-bit address 614, 1 DW of Data 616 and an 8-bit CRC 618. Response phase 204 may include an 8-bit response code 622, a 16-bit status 624 and CRC 630.

As described earlier, in various embodiments, the ICCI may be configured such that the transactions may be posted, or non-posted, as well as completion deferred. FIG. 7 illustrates a master component initiated non-posted transaction, in accordance with various embodiments. In various embodiments, the ICCI may be configured such that a master component initiated non-posted transaction may be terminated as a connected completion when the data and all the information needed to generate the response are immediately available. As shown, a non-post transaction may be initiated by logic unit 144 of ICCI master side 142 during command phase 202 with e.g., a PUT_NP (non-posted) command 712, followed by an associated header (HDR) 714, and a CRC 718. In response, logic unit 154 of ICCI slave side 152 during response phase may respond with an ACCEPT response code 722, followed by a status (STS) 724, a header (HDR) 726, data 728 and CRC 730. The valid responses for non-posted transactions terminated as connected, in addition to ACCEPT, may be FATAL ERROR or NON-FATAL ERROR instead.

Figure 9:
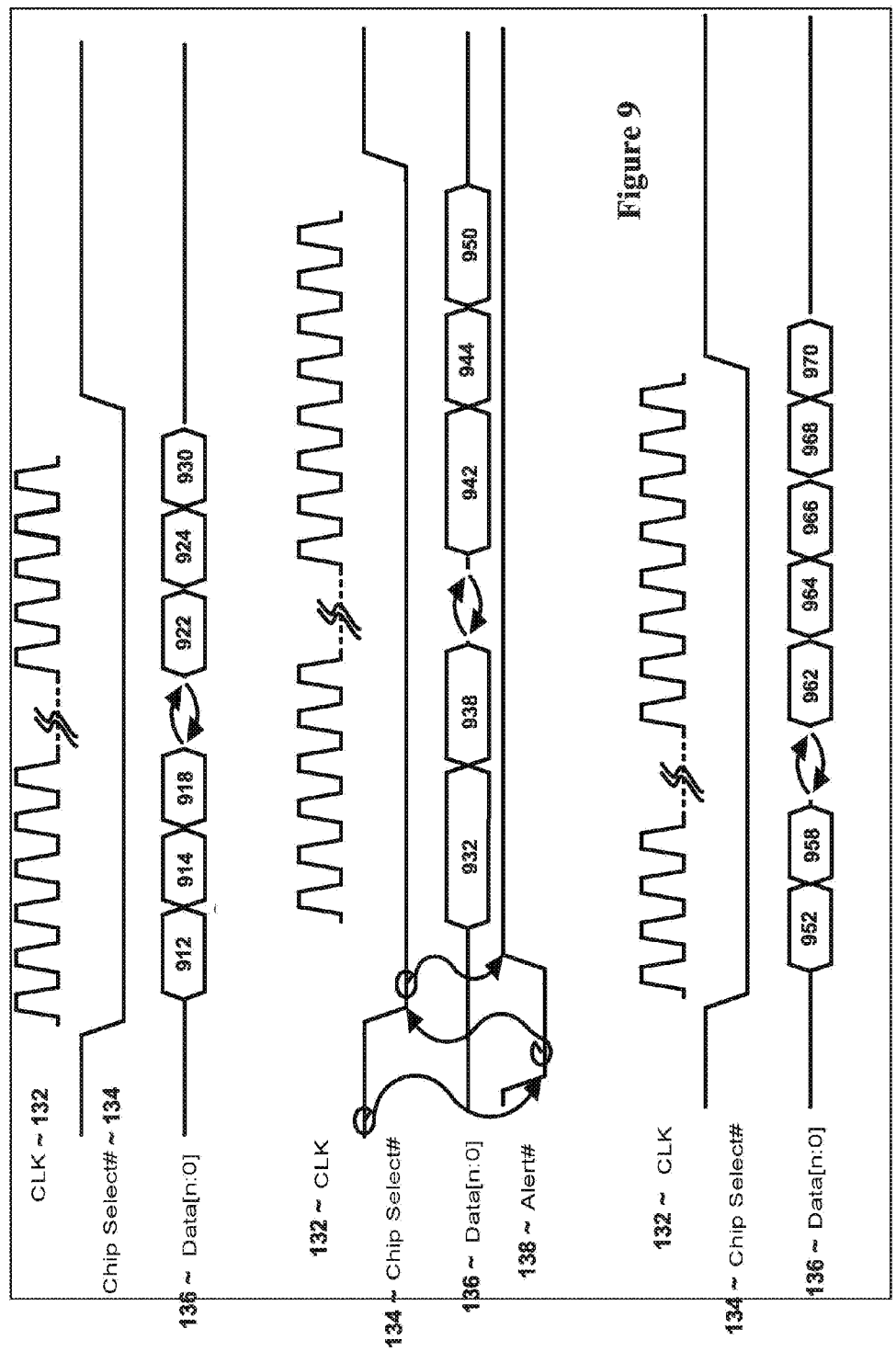
FIG. 9 illustrates a deferred master component initiated non-posted transaction.

In various embodiments, if a master initiated non-posted completion requires data or additional information which is not available immediately, the non-posted request may be terminated with a "DEFER" response. FIG. 9 illustrates a deferred master component initiated non-posted transaction, in accordance with various embodiments. As shown and earlier described, a non-post transaction may be initiated by logic unit 144 of ICCI master side 142 during command phase 202 with e.g., a PUT_NP (non-posted) command 912, followed by an associated header (HDR) 914, and a CRC 918. In response, by virtue of the required data not available immediately, logic unit 154 of ICCI slave side 152 during response phase may respond with a DEFER response code 922, followed by a status (STS) 924 and CRC 930.

The deferred completion may be returned some time in the future when the data or information is eventually available. In the meantime, ICCI may be used for other transactions prior to the defer completion being returned. At a later time, when the required data or information become available, logic unit 154 of ICCI slave side 152 may drive alert pin 138 to provide an alert signal to ICCI master side 154. On alert, as described earlier, logic unit 144 of ICCI master side 142 may initiate a command phase, issuing a Get_Status command 932 (followed by CRC 938). In response, logic unit 154 of ICCI slave side 152 during response phase 204 may provide a response code 942 indicating the data of a previously deferred transaction is now available (followed by a status 944 and CRC 950).

Upon learning of the availability of the deferred data/information, logic unit 144 of ICCI master side 142 may initiate another command phase, issuing a Get_Complete command 952 (followed by CRC 958). In response, logic unit 154 of ICCI slave side 152 during response phase may then respond with an ACCEPT response code 962, followed by a status (STS) 964, a header (HDR) 966, data 968 and CRC 970. As with non-deferred completion, in addition to ACCEPT, the deferred completion response code may be FATAL ERROR or NON-FATAL ERROR also.

In various embodiments, ICCI slave side 152 may be configured to be able to a non-posted transaction with multiple split completions. Further, ICCI may be configured such that if one of the split completions has an unsuccessful completion status, the remaining split completions will not be returned.

Figure 10:
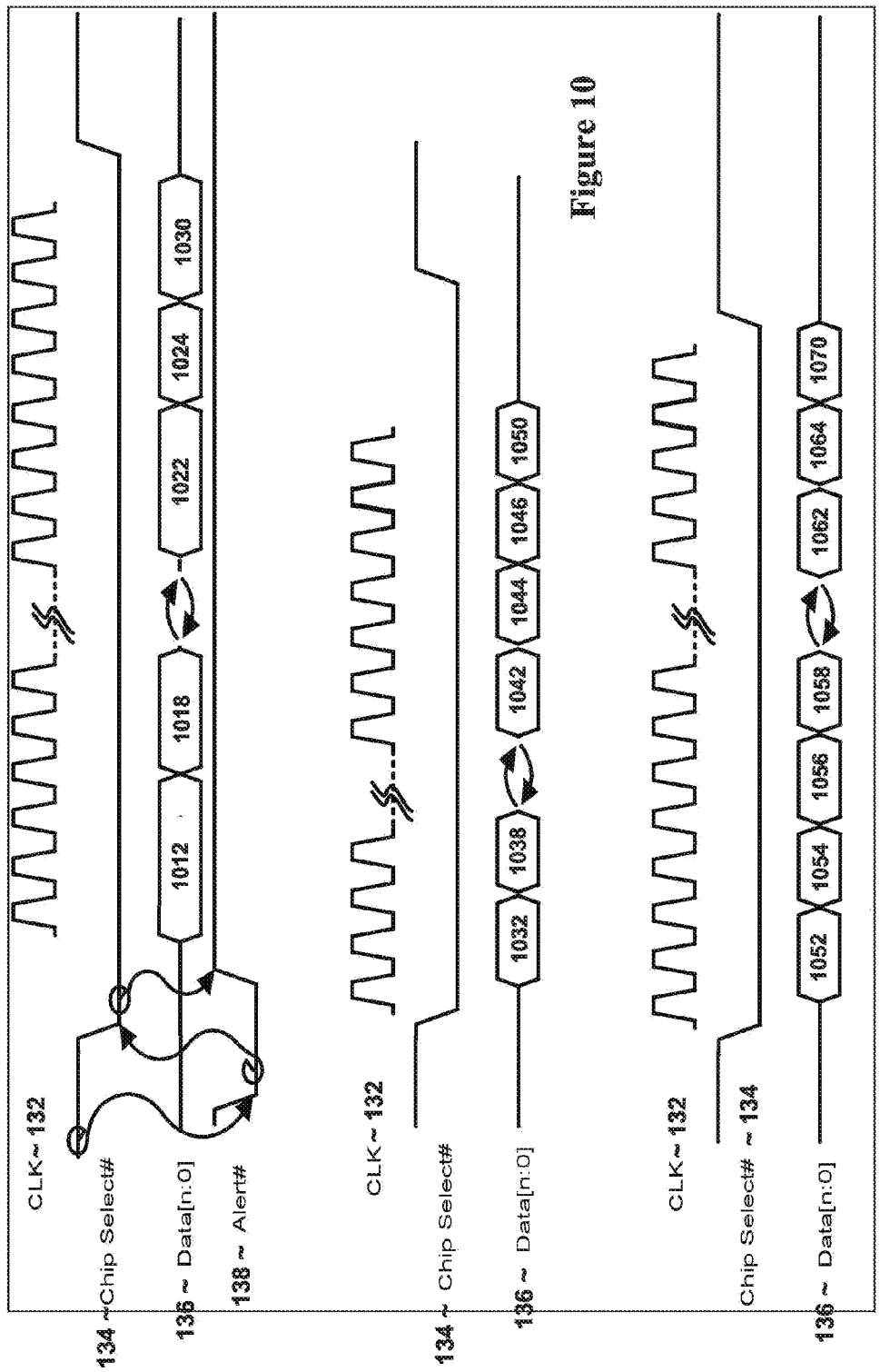
FIG. 10 illustrates a slave component initiated non-posted transaction.

In various embodiments, ICCI slave side 152 may be configured to initiate a non-posted transaction. FIG. 10 illustrates a slave component initiated non-posted transaction, in accordance with various embodiments. As shown, logic unit 154 of ICCI slave side 152 may initiate a non-post transaction by first providing alert signal 138 to ICCI master side 142. On alert, as described earlier, logic unit 144 of ICCI master side 142 may initiate a command phase, issuing a Get_Status command 1012 (followed by CRC 1018). In response, logic unit 154 of ICCI slave side 152 during response phase 204 may provide a response code 1022 indicating the service needed (followed by a status 1024 and CRC 1030). On learning of the service requested, logic unit 144 of ICCI master side 142 may initiate a command phase 202, issuing a Get_NP command 1032 (followed by CRC 1038). In response, logic unit 154 of ICCI slave side 152 during response phase 204 may provide a response code 1042 for the non-posted transaction (followed by a status (STS) 1044, a header (HDR) 1046, and CRC 1050). Once the completion data and the information needed to respond to the non-post transaction is available, logic unit 144 of ICCI master side 142 may initiate another command phase 202, issuing a PUT_CP command 1052, followed by the data 1054, header 1056, and CRC 1058. In response, logic unit 154 of ICCI slave side 152 during response phase 204 may provide an ACCEPT response code 1062 for the data, followed by a status (STS) 1064, and CRC 1070.

FIG. 8 illustrates a master component initiated posted transaction, in accordance with various embodiments. As shown, logic unit 144 of ICCI master side 142 may initiate a posted transaction by initiating command phase 202, issuing a PUT_PC command 812, followed by a header 814, data 816, and CRC 818. In response, logic unit 154 of ICCI slave side 152 during response phase 204 may provide an ACCEPT response code 822 for the data, followed by a status (STS) 824, and CRC 830. As with earlier described transactions, in addition to ACCEPT, response code may be FATAL ERROR or NON-FATAL ERROR if the posted transaction is invalid.

Figure 11:
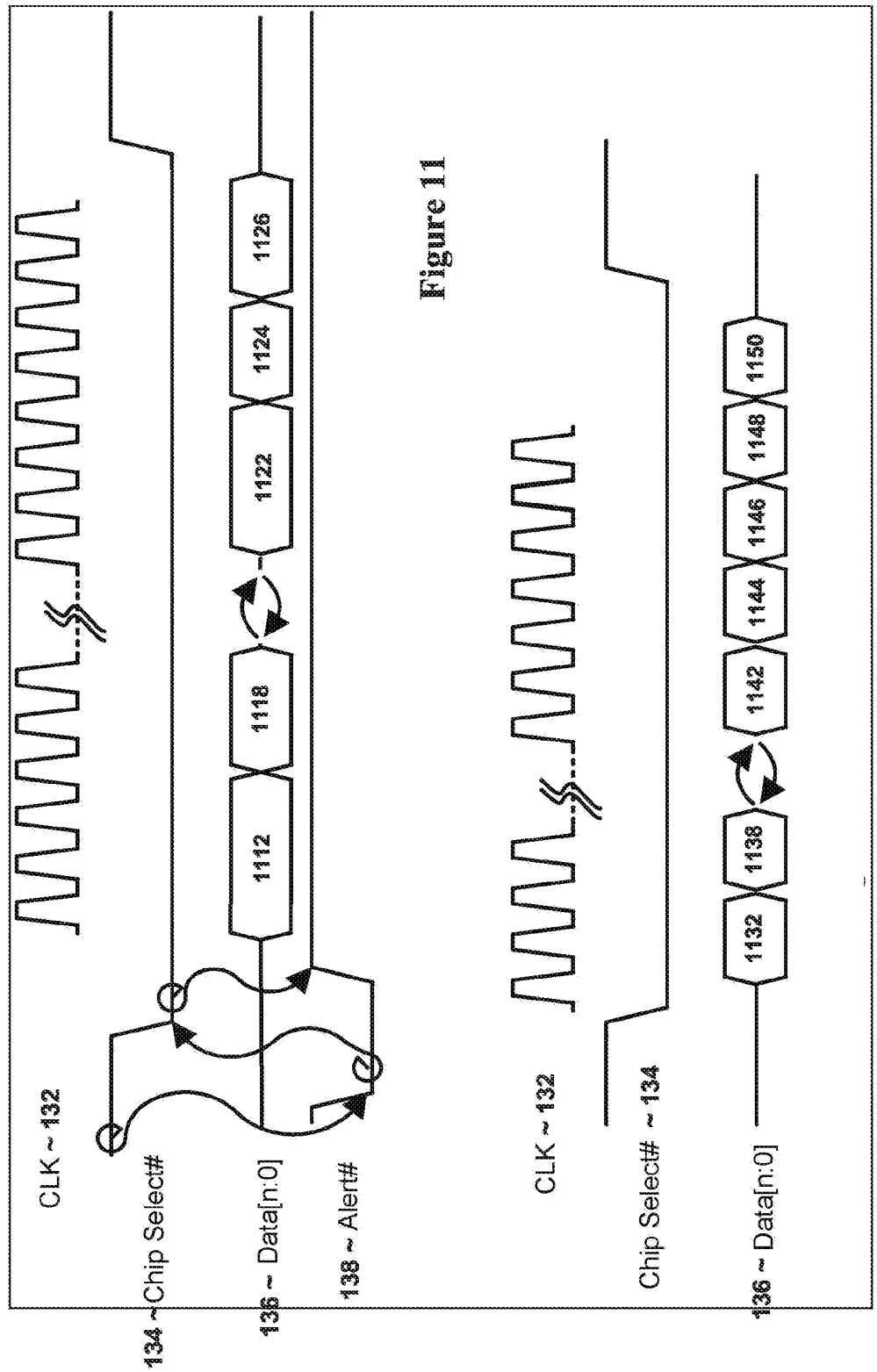
FIG. 11 illustrates a slave component initiated posted transaction.

FIG. 11 illustrates a slave component initiated posted transaction, in accordance with various embodiments. As shown, logic unit 154 of ICCI slave side 152 may initiate a posted transaction by first providing alert signal 138 to ICCI master side 142. On alert, as described earlier, logic unit 144 of ICCI master side 142 may initiate a command phase 202, issuing a Get_Status command 1112 (followed by CRC 1118). In response, ICCI slave side 152, after TAR phase 203, may enter response phase 204, and respond with a response code 1122, status 1124 (indicating a posted transaction), and CRC 1126. On learning of the posted transaction, logic unit 144 of ICCI master side 142 may initiate another command phase 202, issuing a GET_PC command 1132 to get the posted transaction, followed by CRC 1138. In response, logic unit 154 of ICCI slave side 152 during response phase 204 may provide an ACCEPT response code 1142, followed by a status (STS) 1144, header (HDR) 1146, data 1148 containing the posted transaction, and CRC 1150.

Figure 12:
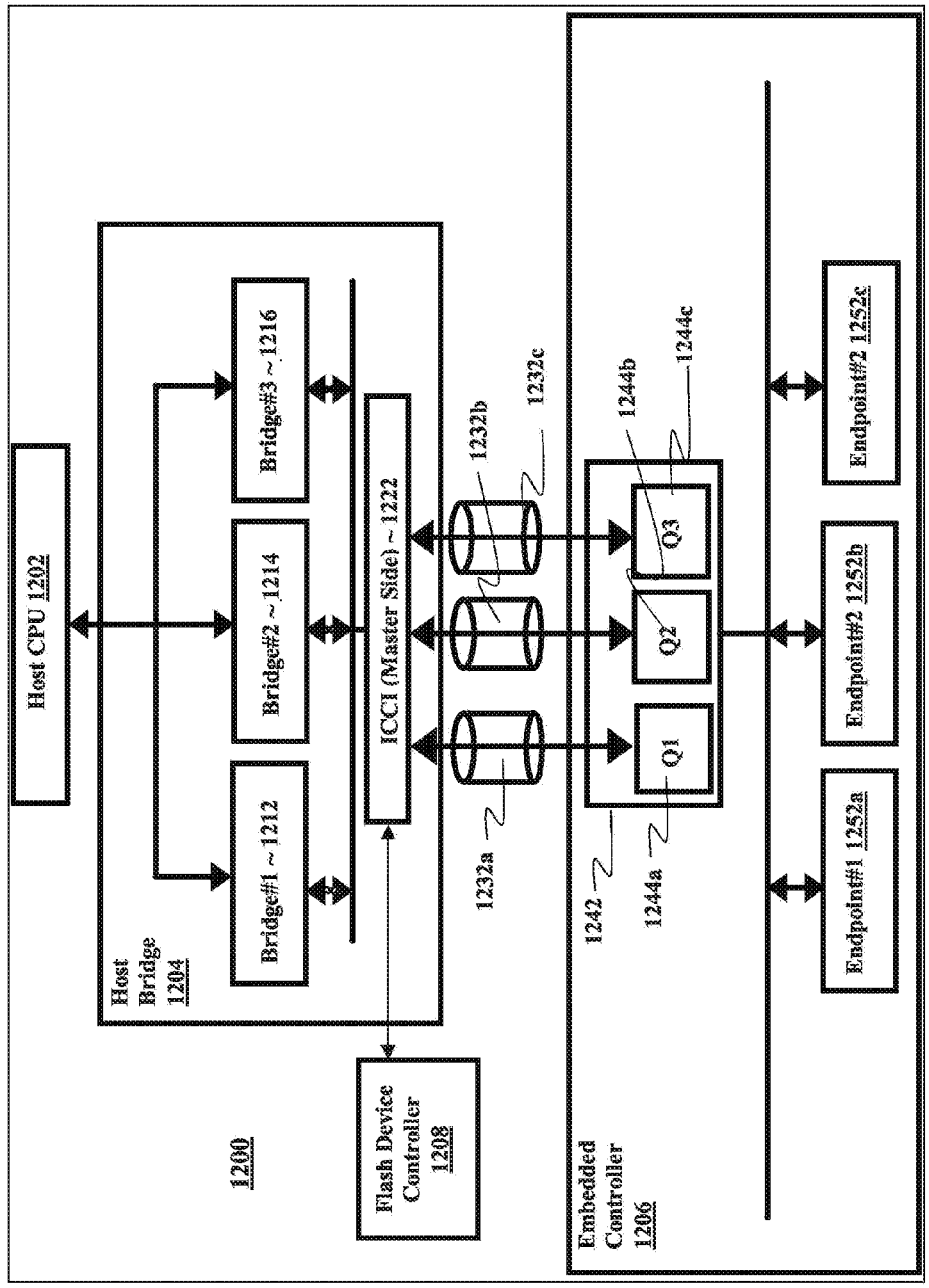
FIG. 12 illustrates an example computing system having a master component and a slave component communication arrangement.

FIG. 12 illustrates an example computing system incorporated with the single master-single slave ICCI embodiment of the present disclosure. As shown, computing system 1200 include host CPU 1202 and host bridge 1204, coupling embedded controller 1206 to host CPU 1202. Host CPU 1202 may include one or more processors, each processor having one or more processor cores. Host bridge 1204 may be configured with ICCI master side 1222, while embedded controller 1206 may be configured with ICCI slave side 1242. Further, computing system 1200 may include Flash device controller 1208 coupled to ICCI master side 1222.

Embedded controller 1206 may include multiple endpoint controller functions, e.g. endpoint#1 1252*a*, endpoint#2 1252*b*, and endpoint#3 1252*c*, configured to service different endpoint peripherals in communicating with host CPU 1202 respectively through bridge#1 1212, bridge#2 1214 and bridge#3 1216, or with other devices, such as Flash device 1208. As described, ICCI slave side 1242 may be configured with corresponding queues 1244*a*-1244*c* to facilitate the respective communications between endpoints 1252*a*-1252*c* and bridges 1212-1216, through corresponding channels 1232*a*-1232*c*.

Examples of endpoint#1 1252*a*, endpoint#2 1252*b*, and endpoint#3 1252*c* may include but are not limited to a virtual wire controller, a tunneled SMBus controller, a Flash controller. Examples of bridge#1 1212, bridge#2 1214 and bridge#3 1216 may include, but are not limited to bridges for tunneled virtual wire, tunneled SMBUS, and so forth.

In embodiments, one or more of endpoint#1 1252*a*, endpoint#2 1252*b*, and endpoint#3 1252*c* may be configured to support a touch screen, one or more cameras, wired or wireless communication. In embodiments, computer system 1200 may be a desktop computer, a laptop computer, a tablet computer, a smartphone, a set-top box, a game controller and so forth.

Figure 13:
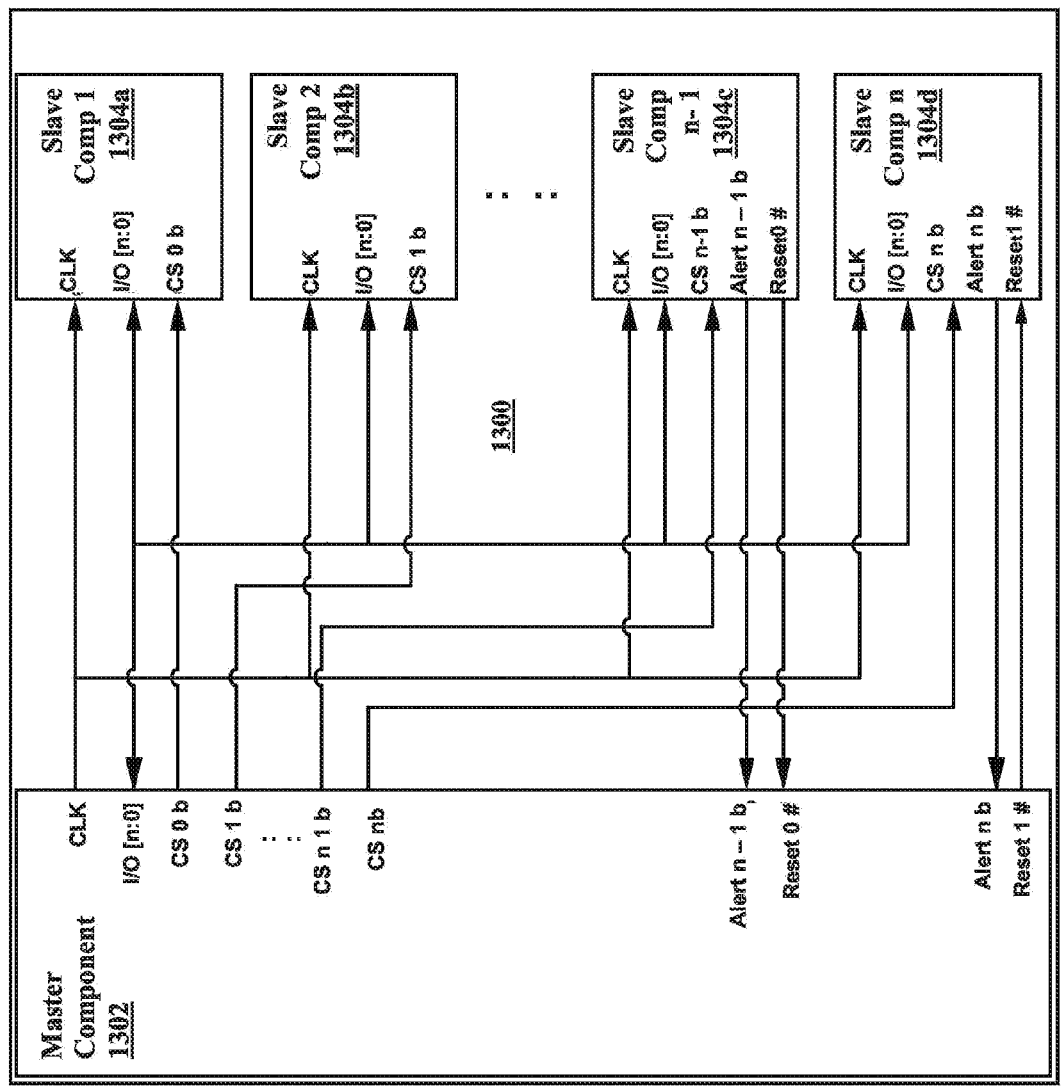
FIG. 13 illustrates a single master component and multiple slave components communication arrangement.

FIG. 13 illustrates a single master-multiple slave arrangement, in accordance with various embodiments. As shown, for these embodiments, a master component 1302 may be coupled with multiple slave components 1304*a*-1304*d*. The number of slave components 1304*a*-1304*d* that may be coupled to master component 1302 may be limited only by electrical load and length of the signal paths.

For the embodiments, the clock and data (I/O [n:0]) pins of ICCI master side of master component 1302 may be shared by the respective clock and data (I/O [n:0]) pins of ICCI slave side of slave components 1304*a*-1304*d*. However, corresponding Chip Select# and Alert# pins may be respectively provided to the ICCI master side, and the multiple ICCI slave sides. Further, for the embodiments, two (2) reset pins may be provided. One reset pin for slave components of a first type to reset the ICCI, and another reset pin for the master component to reset ICCI for slave components of a second type. Slave components of the first type may include EC and BMC devices. Slave components of the second type may include non-EC/BMC devices.

In various embodiments, at any one time, only one of the Chip Select# pins may be asserted, and during which, command and data transfer may occur between master component 1302 and the selected slave component 1304. In various embodiments, when asserting its own alert signal, the asserting slave component 1304 may hold the state of the alert signal, until its Chip Select# signal is asserted by master component 1302.

In various embodiments, the TAR time between the command phase and the response phase may be different between different slave components 1304. In embodiments, master component 1302 may choose to use a common TAR values for all slave components or choose to optimize the performance by using different TAR values for different slave components.

In embodiments, prior to initialization, a fixed $T_{Initial\_TAR}$ value supported by all master and slave components 1302 and 1304 may be used as the initial TAR time. Once initialization is complete, master component 1302 may change the TAR value to be used by a slave through the SET_CONFIGURATION command. The new TAR value may be any value, as long as it is within the supported range advertised by the slave components. In embodiments, the new TAR value will be effective starting from the next Chip Select# assertion.

Figure 14:
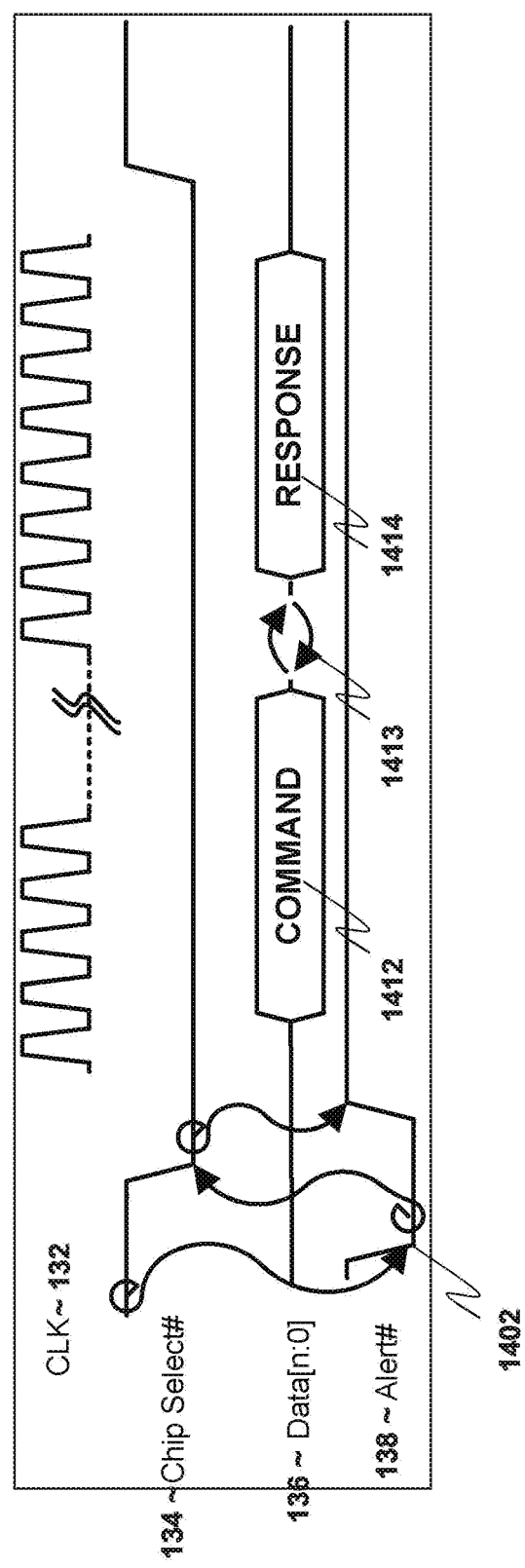
FIG. 14 illustrates a command and response communication protocol of the single master component and multiple slave components communication arrangement.

FIG. 14 illustrates an overview of the communication protocol of the one master-multiple slave arrangement, in accordance with various embodiments. As shown, the communication protocol of the one master-multiple slave arrangement 1300 is the same as earlier described for the one master-one slave arrangement 100. The communication protocol includes a command phase 1412, a TAR phase 1413 and a response phase 1414. Both master and slave components may initiate transactions. The transactions may be posted, non-posed, as well as deferred completion. The only difference between the arrangements is alert signals 1402 being provided from a slave component 1304*a*-1304*d* to master component 1302 through the corresponding alert pin# (as opposed to the possible use of one of the I/O[1] pins).

Figure 15:
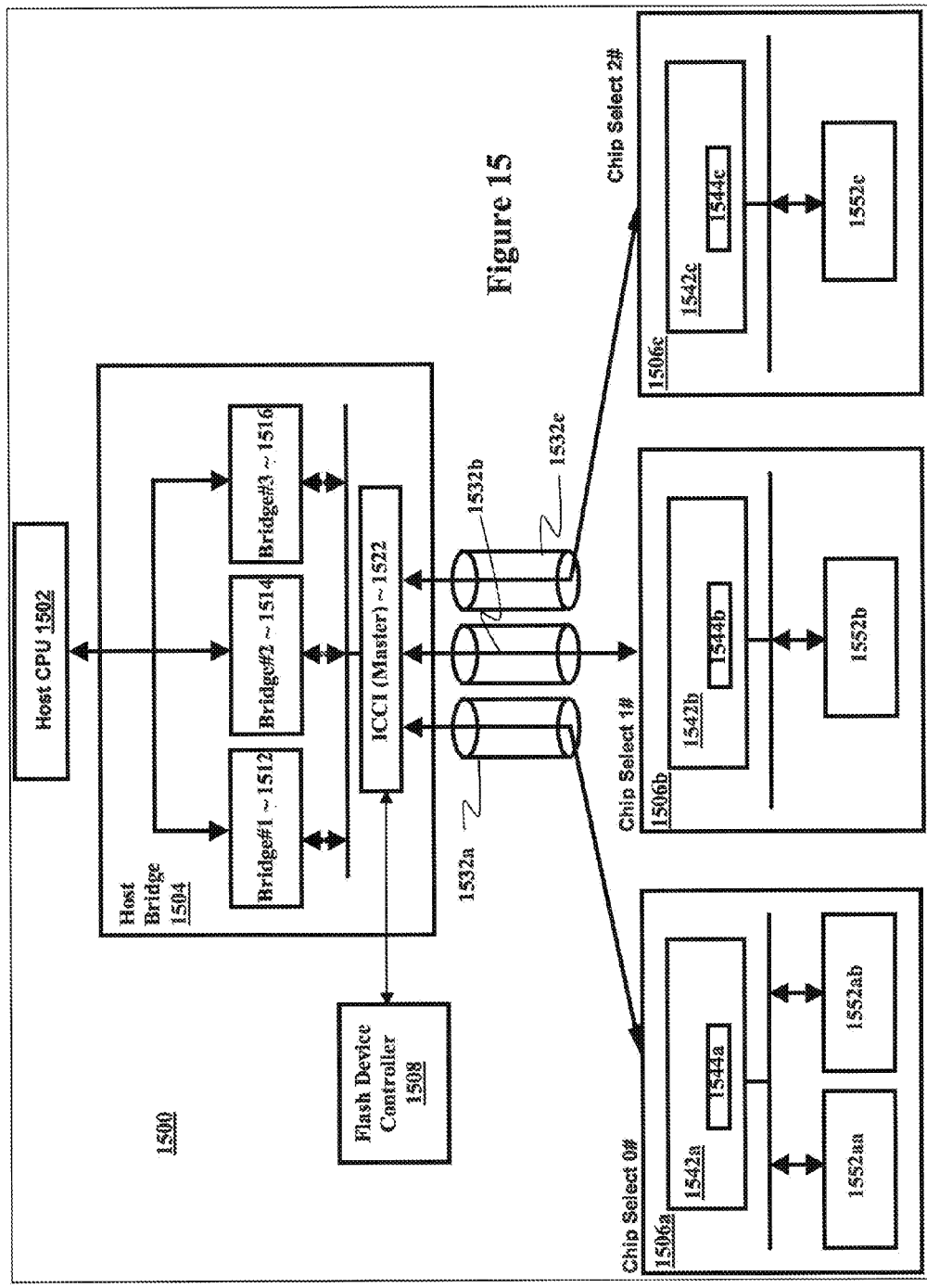
FIG. 15 illustrates an example computing system having a master component and multiple slave components communication arrangement, all arranged in accordance with embodiments of the present disclosure.

FIG. 15 illustrates an example computing system incorporated with the single master-multiple slave ICCI embodiment of the present disclosure. As shown, computing system 1500 include host CPU 1502 and host bridge 1504, coupling slave components 1506*a*-1506*c* to host CPU 1502. Host CPU 1502 may include one or more processors, each processor having one or more processor cores. Host bridge 1504 may be configured with ICCI master side 1522, while slave components 1506*a*-1506*c* may be respective configured with ICCI slave sides 1542*a*-1542*c*. Further, computing system 1500 may include Flash device controller 1508 coupled to ICCI master side 1522.

Slave components 1506*a*-1506*c* may respectively include multiple endpoint controller functions, e.g. endpoint#1 1552*aa*, endpoint#2 1252*ab* endpoint#3 1552*b*, and endpoint#4 1552*c*, configured to service different endpoint peripherals in communicating with host CPU 1502 respectively through bridge#1 1512, bridge#2 1514 and bridge#3 1516, or with other devices or device controllers, such as Flash device controller 1508. Similar to arrangement 1200, ICCI slave sides 1542*a*-1542*c* may be configured with respective queues 1544*a*-1544*c* to facilitate the respective communications between endpoints 1552*aa*-1552*ab* and 1552*b*-1552*c* and bridges 1512-1516 through corresponding channels 1532*a*-1532*c*.

Examples of the various endpoints 1552*aa*-1552*ab* and 1552*b*-1552*c* may include but are not limited to a virtual wire controller, a tunneled SMBus controller, or a Flash controller. Examples of the various bridges 1512-1516 may include, but are not limited to bridges for tunneled virtual wire, tunneled SMBUS, and so forth.

In embodiments, one or more of endpoint#1 1552*a*, endpoint#2 1552*b*, and endpoint#3 1552*c* may be configured to support a touch screen, one or more cameras, wired or wireless communication. In embodiments, computer system 1500 may be a desktop computer, a laptop computer, a tablet computer, a smartphone, a set-top box, a game controller and so forth.

Accordingly, an inter-component communication arrangement with optimal balance between lower cost and medium bandwidth has been described.

The arrangement, in embodiments, include a component with inter-component communication capabilities. The component may include a plurality of control pins including a clock pin, and a plurality of data pins. The component may further include a logic unit coupled to the plurality of control and data pins and configured to receive a clock signal from another component through the clock pin, to provide an alert signal to the other component through a selected one of the control and data pins to initiate a transaction with the other component, to receive in response to the alert signal from the other component through the data pins a status request to determine nature of the transaction, and to provide in response to the status request to the other component through the data pins a status to indicate the nature of the transaction. The provision of the alert signal, the receipt of the status request and the provision of the status may reference the clock signal.

In embodiments, the logic unit may be configured to provide the alert signal to the other component through one of the data pins. The plurality of control pins may further include an alert pin, and the logic unit may be configured to provide the alert signal to the other component through the alert pin. The logic unit may also be configured to receive a command from the other component through the data pins in response to the status to get data associated with the transaction, and to send to the other component through the data pins in response to the command the data associated with the transaction.

In embodiments, the component may further include a queue configured to store pending transactions, and the logic unit may be coupled to the queue and configured to provide the alert signal to the other component to initiate a transaction whenever there is at least one pending transaction in the queue. The transaction may be associated with one of a plurality of independent channels, and the component may include a plurality of queues respectively associated with the independent channels. Further, the logic unit may be coupled to the queues and configured to provide the alert signal to the other component to initiate a transaction whenever there is at least one pending transaction in one of the queues. The channel may be associated with accessing a peripheral, virtual wire messaging, out-of-bound messaging or accessing a storage device.

In embodiments, the component may further include a reset pin, and the logic unit is coupled to the reset pin, and configured to provide a reset signal to the other component to reset at least the two components. The component may be a selected one of an embedded controller or a baseband management controller.

In embodiments, the arrangement may include a component with inter-component communication capabilities having a plurality of control pins including a clock pin, and a plurality of data pins. The component may further include a logic unit coupled to the plurality of control and data pins and configured to provide a clock signal to another component through the clock pin, to receive an alert signal from the other component through a selected one of the control and data pins to initiate a transaction with the component, to transmit in response to the alert signal to the other component through the data pins a status request to determine nature of the transaction, and to receive in response to the status request from the other component through the data pins a status to indicate the nature of the transaction. The receipt of the alert signal, the transmission of the status request and the receipt of the status may reference the clock signal.

In embodiments, the logic unit may be configured to receive the alert signal from the other component through one of the data pins. The plurality of control pins may further include an alert pin, and the logic unit may be configured to receive the alert signal from the other component through the alert pin. The logic unit may be further configured to transmit through the data pins a command to the other component to get data associated with the transaction, and to receive from the other component through the data pins the data associated with the transaction. The transaction may be associated with one of a plurality of independent channels, and the channel is associated with accessing a peripheral, virtual wire messaging, out-of-bound messaging or accessing a storage device.

In embodiments, the component may further include a reset pin, and the logic unit is coupled to the reset pin, and configured to receive a reset signal from the other component to reset at least the two components. The component may be a bridge configured to bridge the other component to at least a host central processing unit of a system where the components are disposed.

In embodiments, the arrangement may include a system having a processor, a controller, and a bridge coupling the controller to the processor. The controller may include a plurality of control pins including a clock pin, and a plurality of data pins. The controller may further include a logic unit coupled to the plurality of control and data pins and configured to receive a clock signal from the bridge through the clock pin, to provide an alert signal to the bridge through a selected one of the control and data pins to initiate a transaction with the bridge, to receive in response to the alert signal from the bridge through the data pins a status request to determine nature of the transaction, and to provide in response to the status request to the bridge through the data pins a status to indicate the nature of the transaction. The provision of the alert signal, the receipt of the status request and the provision of the status may reference the clock signal.

In embodiments, the logic unit may be configured to provide the alert signal to the bridge through one of the data pins. The plurality of control pins may further include an alert pin, and the logic unit may be configured to provide the alert signal to the bridge through the alert pin. The logic unit may be further configured to receive a command from the bridge through the data pins in response to the status to get data associated with the transaction, and to send to the bridge through the data pins in response to the command the data associated with the transaction. The controller may further include a queue configured to store pending transactions, and the logic unit is coupled to the queue and configured to provide the alert signal to the bridge to initiate a transaction whenever there is at least one pending transaction in the queue.

The transaction may be associated with one of a plurality of independent channels, and wherein the controller comprises a plurality of queues respectively associated with the independent channels, and the logic unit may be coupled to the queues and configured to provide the alert signal to the bridge to initiate a transaction whenever there is at least one pending transaction in one of the queues. The channel may be associated with virtual wire messaging, out-of-bound messaging or accessing a storage device.

The controller may further include a reset pin, and the logic unit may be coupled to the reset pin, and configured to provide a reset signal to the bridge to reset at least the two components. The controller may be a selected one of an embedded controller or a baseband management controller.

In embodiments, the bridge may include a plurality of control pins including a clock pin, and a plurality of data pins. The bridge may further include a logic unit coupled to the plurality of control and data pins of the bridge and configured to provide the clock signal to the controller through the clock pins, to receive the alert signal from the controller through a selected one of the control and data pins of the bridge, to transmit in response to the alert signal to the controller through the data pins the status request, and to receive in response to the status request from the controller through the data pins the status to indicate the nature of the transaction. The receipt of the alert signal, the transmission of the status request and the receipt of the status may reference the clock signal.

The logic unit of the bridge may be configured to receive the alert signal from the controller through one of the data pins of the bridge. The plurality of control pins of the bridge may further include an alert pin, and the logic unit of the bridge may be configured to receive the alert signal from the controller through the alert pin of the bridge. The logic unit of the bridge may be further configured to transmit the command to the controller through the data pins, and to receive from the controller through the data pins the data associated with the transaction.

In embodiments, the bridge may further include a reset pin, and the logic unit of the bridge may be coupled to the reset pin of the bridge, and configured to receive a reset signal from the controller to reset at least the bridge and the controller.

What is claimed is:

1. An apparatus comprising:
a clock (CLK) pin;
a plurality of input/output (I/O) pins [n:0];
a chip select pin;
an Alert pin; and
a logic unit to cause a slave initiated posted or non-posted transaction, wherein
the slave initiated posted transaction comprises transmission of an alert signal using the Alert pin and includes transmission of a response code using at least one of the I/O pins in response to receipt of a Get_Status command and a cyclic redundancy check (CRC) value on at least one of the I/O pins and
the slave initiated non-posted transaction comprises transmission of an alert signal using the Alert pin and includes transmission of a response code using at least one of the I/O pins in response to receipt of a Get_Status command and a CRC value on at least one of the I/O pins.

2. The apparatus of claim 1, wherein the slave initiated posted transaction comprises:
receipt of a GET_PC command and a second CRC value and
transmission of an ACCEPT response code and one or more of: a status (STS), a header (HDR), data, or a CRC value.

3. The apparatus of claim 1, wherein the slave initiated non-posted transaction comprises:
receipt of a Get_NP command and a second CRC value,
in response to receipt of the Get_NP command, transmission of an ACCEPT response code and one or more of a status (STS), a header (HDR), or a CRC value,
receipt of a PUT_PC command and one or more of: data, an HDR, or a CRC value, and
in response to receipt of the PUT_PC command, transmission of an ACCEPT response code and one or more of: an STS or a CRC value.

4. The apparatus of claim 1, further comprising a status register.

5. The apparatus of claim 1, wherein the Alert pin comprises an Alert# pin.

6. The apparatus of claim 1, further comprising at least one of:
a virtual wire controller, a tunneled SMBus controller, a Flash controller, a touch screen, or a camera.

7. The apparatus of claim 2, wherein
the GET_PC command comprises a request to get a posted or completion header and optional data.

8. The apparatus of claim 3, wherein
the Get_NP command comprises a request to get a non-posted header and optional data and
the PUT_PC command comprises a request to put a posted or completion header and optional data.

9. The apparatus of claim 6, further comprising:
a host bridge;
a flash device controller; and
a host central processing unit, the host bridge communicatively coupled to the flash device controller, the host central processing unit, and the logic unit.

10. The apparatus of claim 9, further comprising:
telephone circuitry and
a display.

11. A method comprising:
receiving a clock signal at a clock (CLK) pin and
causing a slave initiated posted or non-posted transaction, wherein
the slave initiated posted transaction comprises transmitting an alert signal using an Alert pin and includes transmitting a response code using at least one I/O pin in response to receipt of a Get_Status command and a cyclic redundancy check (CRC) value on at least one I/O pin and
the slave initiated non-posted transaction comprises transmitting an alert signal using an Alert pin and includes transmitting a response code using at least one I/O pin in response to receipt of a Get_Status command and a CRC value on at least one I/O pin.

12. The method of claim 11, wherein the slave initiated posted transaction comprises:
receiving a GET_PC command and a second CRC value and
transmitting an ACCEPT response code and one or more of: a status (STS), a header (HDR), data, or a CRC value.

13. The method of claim 11, wherein the slave initiated non-posted transaction comprises:
receiving a Get_NP command and a second CRC value,
in response to receipt of the Get_NP command, transmitting an ACCEPT response code and one or more of a status (STS), a header (HDR), or a CRC value,
receiving a PUT_PC command and one or more of: data, an HDR, or a CRC value, and
in response to receipt of the PUT_PC command, transmitting an ACCEPT response code and one or more of: an STS or a CRC value.

14. The method of claim 11, wherein the Alert pin comprises an Alert# pin.

15. The method of claim 12, wherein
the GET_PC command comprises a request to get a posted or completion header and optional data.

16. The method of claim 13, wherein
the Get_NP command comprises a request to get a non-posted header and optional data and
the PUT_PC command comprises a request to put a posted or completion header and optional data.

17. An apparatus comprising:
a clock (CLK) pin to provide a clock signal;
a plurality of input/output (I/O) pins [n:0];
an Alert pin; and
a logic unit to receive a slave initiated posted or non-posted transaction, wherein
the slave initiated posted transaction comprises receipt of an alert signal using the Alert pin, transmission of a Get_Status command and a cyclic redundancy check (CRC) value using at least one of the I/O pins, and receipt of a response code using at least one of the I/O pins and
the slave initiated non-posted transaction comprises receipt of an alert signal using the Alert pin, transmission of a Get_Status command and a CRC value on at least one of the I/O pins, and receipt of a response code on at least one of the I/O pins.

18. The apparatus of claim 17, wherein the slave initiated posted transaction comprises:
transmission of a GET_PC command and a second CRC value and
receipt of an ACCEPT response code and one or more of: a status (STS), a header (HDR), data, or a CRC value.

19. The apparatus of claim 18, wherein:
the GET_PC command comprises a request to get a posted or completion header and optional data.

20. The apparatus of claim 17, wherein the slave initiated non-posted transaction comprises:
   transmission of a Get_NP command and a CRC value, in response to transmission of the Get_NP command, receipt of an ACCEPT response code and one or more of a status (STS), a header (HDR), or a CRC value,
   transmission of a PUT_PC command and one or more of: data, an HDR, or a CRC value, and
   in response to transmission of the PUT_PC command, receipt of an ACCEPT response code and one or more of: an STS or a CRC value.

21. The apparatus of claim 17, wherein the Alert pin comprises an Alert# pin.

22. The apparatus of claim 20, wherein
   the Get_NP command comprises a request to get a non-posted header and optional data and
   the PUT_PC command comprises a request to put a posted or completion header and optional data.

23. A method comprising:
   transmitting a clock signal from a clock (CLK) pin and
   receiving a slave initiated posted or non-posted transaction, wherein
      the slave initiated posted transaction comprises: receiving an alert signal on an Alert pin, transmitting a Get_Status command and a cyclic redundancy check (CRC) value from at least one I/O pin, and receiving a response code on at least one I/O pin and
      the slave initiated non-posted transaction comprises: receiving an alert signal on an Alert pin, transmitting a Get_Status command and a CRC value from at least one I/O pin, and receiving a response code on at least one I/O pin.

24. The method of claim 23, wherein the slave initiated posted transaction comprises:
   transmitting a GET_PC command and a second CRC value and
   receiving an ACCEPT response code and one or more of: a status (STS), a header (HDR), data, or a CRC value.

25. The method of claim 23, wherein the slave initiated non-posted transaction comprises:
   transmitting a Get_NP command and a CRC value,
   receiving an ACCEPT response code and one or more of a status (STS), a header (HDR), or a CRC value,
   transmitting a PUT_PC command and one or more of: data, an HDR, or a CRC value, and
   receiving an ACCEPT response code and one or more of: an STS or a CRC value.

26. The method of claim 23, wherein the Alert pin comprises an Alert# pin.

27. The method of claim 24, wherein
   the GET_PC command comprises a request to get a posted or completion header and optional data.

28. The method of claim 25, wherein
   the Get_NP command comprises a request to get a non-posted header and optional data and
   the PUT_PC command comprises a request to put a posted or completion header and optional data.

* * * * *